United States Patent [19]
Jacobs

[11] Patent Number: 5,375,319
[45] Date of Patent: Dec. 27, 1994

[54] GATE ARRAY AND HYBRID REMOVAL TOOL

[75] Inventor: Joseph M. Jacobs, Redondo Beach, Calif.

[73] Assignee: Hughes Aircraft Company, Los Angeles, Calif.

[21] Appl. No.: 179,287

[22] Filed: Jan. 10, 1994

[51] Int. Cl.$^5$ ............................................. H05K 13/00
[52] U.S. Cl. ........................................ 29/762; 29/267; 29/426.4; 29/764
[58] Field of Search .............. 29/762, 764, 267, 426.4, 29/426.5, 825, 829

[56] References Cited

U.S. PATENT DOCUMENTS

| | | | |
|---|---|---|---|
| 5,191,705 | 3/1993 | Toensing | 29/764 |
| 5,224,263 | 7/1993 | Hamburgen | 29/762 |

*Primary Examiner*—Carl E. Hall
*Attorney, Agent, or Firm*—Leonard A. Alkov; W. K. Denson-Low

[57] ABSTRACT

A removal tool for removing a component bonded to a printed wiring board. A housing and securing mechanism are provided for securing the printed wiring board to the housing. An adapter holds the component that is to be removed. A variable jaw assembly applies a closing force to the adapter to hold the component. A spanner assembly comprises a variable position slider block for holding the jaw assembly in a vertical orientation, and locking devices for securing it to the housing. A second securing mechanism is provided for locking the slider block to secure the variable jaw assembly. A torque handle assembly is coupled to the jaw assembly that is rotatable to apply torque to the component to break the bond between the component and the printed wiring board. The securing mechanism comprises a support block, an end stop, a swivel block disposed opposite the end stop, and a locking device for supporting and holding the printed wiring board in the housing. The slider block is captivated by a slot in the spanner assembly that is used to lock the jaw assembly in a vertical direction. The slot provides a limit to rotation when force is applied to the handles during removal of the component. The torque handle assembly comprises two L-shaped blocks for grasping a shaft of the variable jaw assembly and anchoring two dowel pins. The variable jaw assembly comprises a housing, two pivotable jaws secured to the housing that are each rotatable around a pivot shaft, a partially threaded shaft having a left-hand threaded portion and a right-hand threaded portion disposed through the respective jaws, and a disk attached to a center portion of the partially threaded shaft having that permits turning thereof in response to rotation of the disk. The removal tool permits safe removal of components from printed wiring boards without damage to the surface thereof or to the component. The removal tool provides the capability of grasping and removing components of various sizes and shapes that are confined in the midst of other adjacent components on the surface of the printed wiring board.

13 Claims, 3 Drawing Sheets

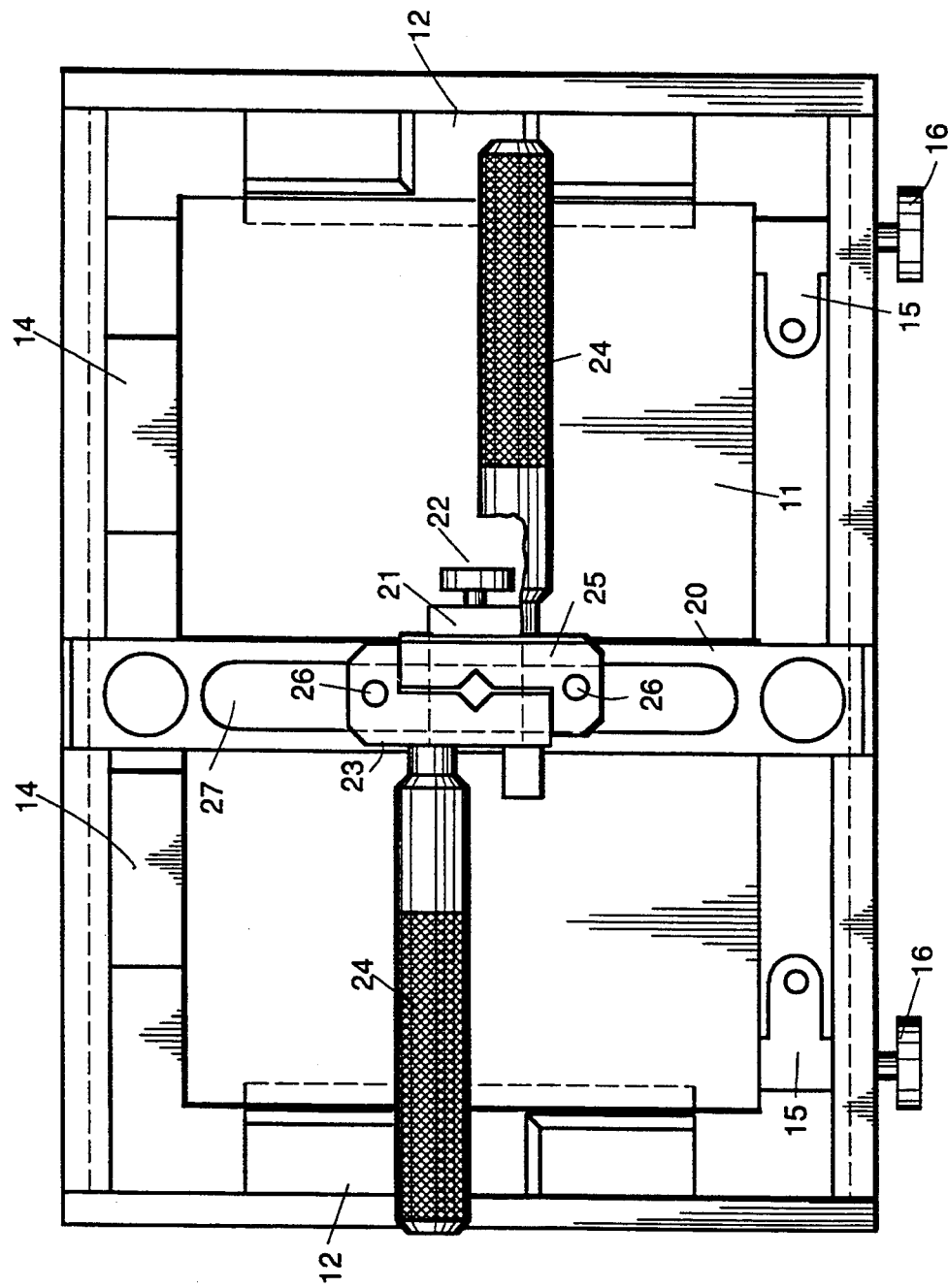

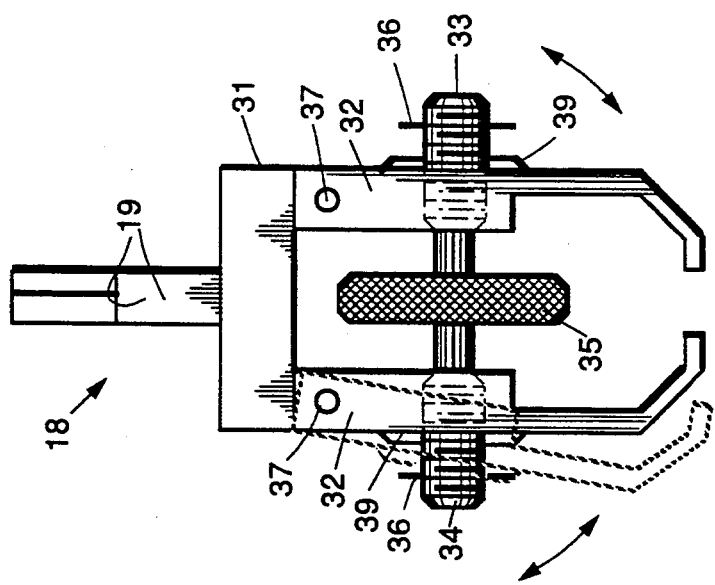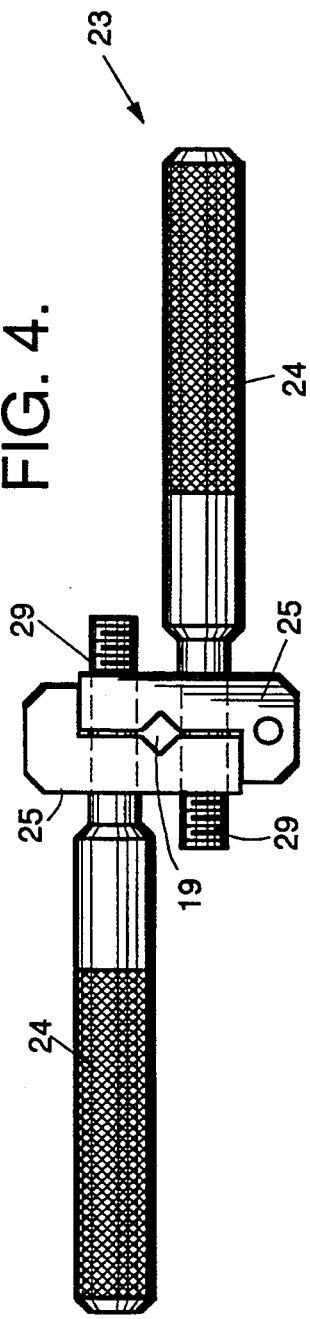

GATE ARRAY AND HYBRID REMOVAL TOOL

BACKGROUND

The present invention relates to gate arrays and hybrids, and more particularly, to a removal tool for use with such gate arrays and hybrids disposed on printed wiring boards.

Many electronic components, such as gate arrays and hybrids, are attached to a surface of a printed wiring board with polysulfide adhesive. This is commonly referred to as bonding. The bonding material (polysulfide adhesive), when cured, requires a considerable force to break in order to remove the component.

The prior an techniques for which the present tool relates and for which it is an improvement are as follows. One technique uses a thin wire routed under the leads and alternately pulled at the ends to attempt severing the bond material (analogous to cheese slicing). This is not a viable method due to wire breakage and component lead damage without success in cutting thru the bond. In a second technique, heat from a hot air gun is first applyed to the gate array or hybrid, then various wedges are used to break the bond and lift the component. This results in component damage with only marginal success on components smaller than 0.5 inches square. In a third technique, the component is held with a grasping stationary head and the board is rocked while heat is applyed. This method was unsuccessful. Furthermore, none of the above methods proved to be practical.

Therefore, it is an objective of the present invention to provide a removal tool for use with such gate arrays and hybrids disposed on printed wiring boards that does not require the use of heat.

SUMMARY OF THE INVENTION

In order to meet the above and other objectives, the present invention is a removal tool for use with gate arrays and hybrid semiconductor devices, and the like. The removal tool may be used in removing a component bonded to a printed wiring board with bonding material, such as polysulfide adhesive. The removal tool comprises a housing and securing means for securing the printed wiring board to the housing. An adapter is provided for holding the component that is to be removed. A variable jaw assembly that is couplable to the adapter is provided for applying a closing force to the adapter to hold the component. A spanner assembly is coupled to the housing that comprises a variable position slider block for holding the jaw assembly in a vertical orientation relative to the component. Locking means are coupled to the spanner assembly for securing the spanner assembly to the housing. Second securing means are coupled to the spanner assembly for locking the slider block and securing the variable jaw assembly above the component that is to be removed. A lockable and rotatable torque handle assembly is coupled to the jaw assembly that is rotatable to apply torque to the component to break the bond between the component and the printed wiring board.

The securing means comprises a support block for supporting the printed wiring boar, an end stop disposed at one end of the printed wiring board, a swivel block disposed at an end of the printed wiring board opposite the end stop, and a locking means such as a thumb screw, for example, coupled to the swivel block. The slider block is captivated by a slot in the spanner assembly that is used to lock the jaw assembly in a vertical direction. The torque handle assembly comprises two handles and is locked firmly in place by rotating both handles. The slot provides a limit to rotation when force is applied to the handles during removal of the component. The lockable and rotatable torque handle assembly comprises two L-shaped blocks for grasping a shaft of the variable jaw assembly and anchoring two dowel pins. The variable jaw assembly comprises a housing, two pivotable jaws secured to the housing that are each rotatable around a pivot shaft, a partially threaded shaft having a left-hand threaded portion and a right-hand threaded portion disposed through the respective jaws, and a knurled disk attached to a center portion of the partially threaded shaft having that permits turning thereof in response to rotation of the disk.

The present removal tool provides a tool for safely removing gate array and hybrid components from printed wiring boards without damage to the surface of the printed wiring board or to the component. The present removal tool provides the ability to grasp and remove components of various sizes and shapes that are confined in the midst of other adjacent components on the surface of the printed wiring board. The present invention safely removes delicately bonded components that are costly and subject to irreparable damage unless exceptional care in handling is exercised.

The advantages of the removal tool of the present invention are that the structure of the tool assures careful grasping of the component to exert sufficient force to shear the bond. Safeguards are incorporated into the removal tool to protect adjacent components. The printed wiring board is secured in place relative to the force applied to the component. For each different component, only a relatively simple adapter is necessary. Without the present removal tool, a technician might try to use a wedge to lift a component in order to break the bond. This approach most often results in destruction of the component and irreparable damage to the surface of the printed wiring board.

The necessity of the present removal tool is derived from state of the an process requirements for repairing high cost electronic hardware assemblies. The existence of the development of the present removal tool has contributed to advanced applications of larger integrated circuits. The unique features of the present removed tool allows for components to be safely removed in-house and at field repair depots. The present removal tool is well suited for use with many electronic assemblies in the commercial field where surface mounted components are bonded. The present removal tool is easily transported and set-up is minimal.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 2 is a top view of the removal tool of FIG. 1;

FIG. 3 shows the details of a variable jaw assembly employed in the removal tool of FIG. 1; and FIG. 4 shows the torque handle assembly employed in the removal tool of FIG. 1.

DETAILED DESCRIPTION

Figure 1:
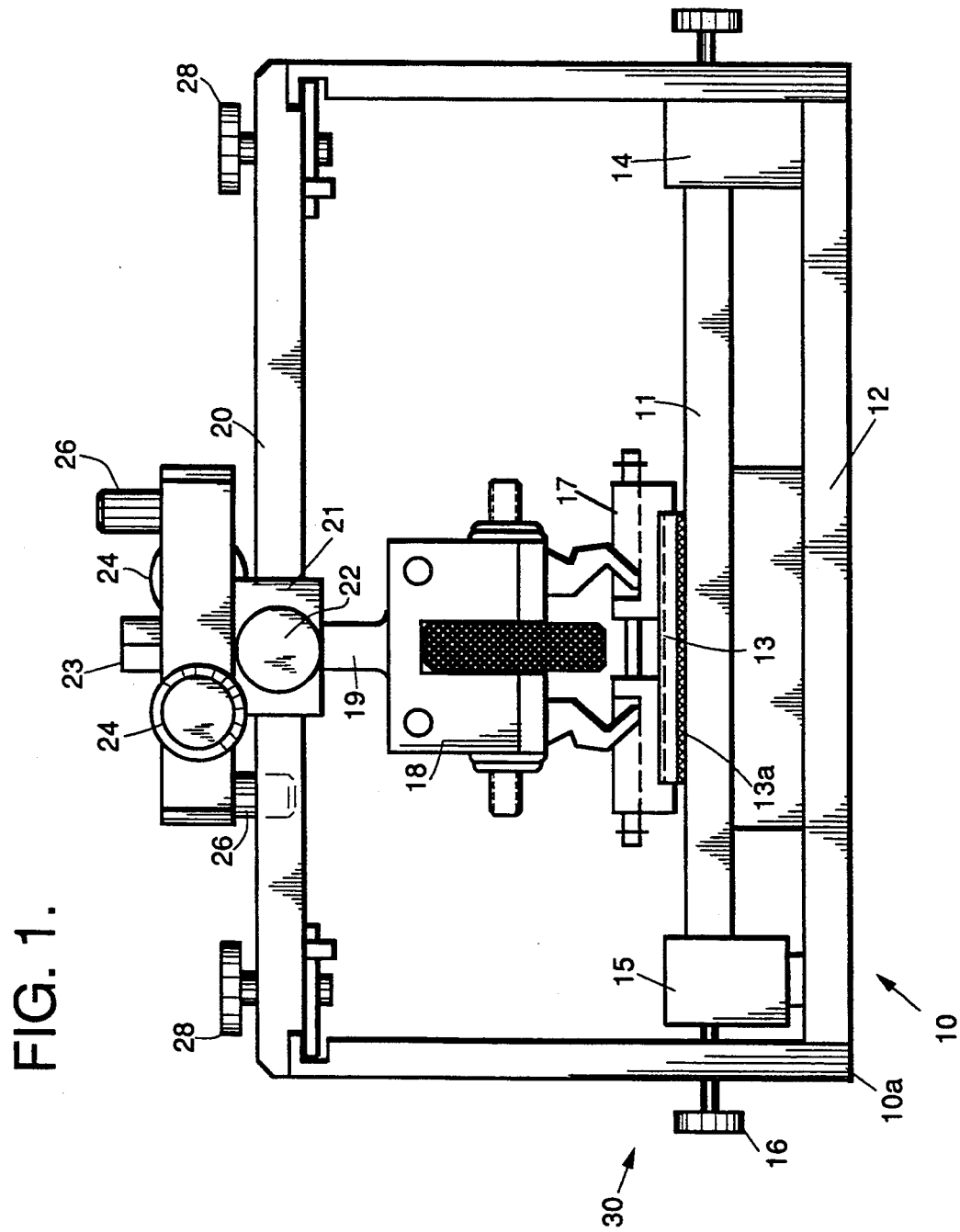
FIG. 1 is a side view of a removal tool in accordance with the principles of the present invention.

Referring to the drawing figures, FIG. 1 is a side view of a removal tool 10 in accordance with the principles of the present invention, and FIG. 2 is a top view of the removal tool 10. The removal tool 10 is adapted to remove an electronic component 13, such as a gate array or hybrid, that is attached to a surface of a printed wiring board 11, or substrate 11, with bonding material 13a, such as polysulfide adhesive, for example. Many electronic components 13, such as gate grays and hybrids, are attached to a surface of a printed wiring board 11 with polysulfide adhesive 13a. The bonding material 13a (polysulfide adhesive), when cured, requires a considerable force to break in order to remove the component 13.

For clarity, the drawing figures show a printed wiring board 11 having only one electronic component 13 bonded thereto. The removal tool 10 is comprised of a housing 10a or support structure. The printed wiring board 11 is firmly secured by securing means 30 that comprises a support block 12 end stop 14 and swivel block 15 that are secured to the housing 10a. The securing means 30 also includes thumb screws 16 disposed through the housing 10a that are used to exert a force against the swivel block 15 to hold the printed wiring board 11 in place between the swivel block 15 and the stop 14 and on top of the support block 12.

An adapter 17 is shown in position to grasp the component 13. A closing force is applied to the adapter 17 to facilitate a firm hold on the component 13 by means of a variable jaw assembly 18. The variable jaw assembly 18 allows for differently configured adapters 17 to be custom fitted to components 13 that vary in size and shape. A shaft 19 of the jaw assembly 18 is held in a fixed vertical alignment by a spanner assembly 20 containing a variable position slider block 21.

The spanner assembly 20 is anchored in place directly over the shaft 19 of the jaw assembly 18 by means of two locking assemblies 28. The slider block 21 is captivated by a slot 27 in the spanner assembly 20 and is used to guide the shaft 19 of the jaw assembly 18 in a vertical ("y") direction. A second thumb screw 22 is used to lock the slider block 21 directly over the component 13 that is to be removed.

A torque handle assembly 23 is disposed around a square portion of the shaft 19 of the variable jaw assembly 18. The torque handle assembly 23 comprises two threaded handles 24 having respective screw threads 29 at an end thereof that penetrate through threaded holes in two L-shaped blocks 25. The L-shaped blocks 25 are locked firmly in place to secure the variable jaw assembly 18 to the shaft 19 by rotating both handles 24 which pulls the two L-shaped blocks 25 together around the shaft 19. A detailed drawing of the torque handle assembly 23 is provided with reference to FIG. 4. The two L-shaped blocks 25 are used to grasp the shaft 19, and to locate two dowel pins 26 in a slot 27 for limiting the rotation of the variable jaw assembly 18 when in operation. One of the dowel pins 26 is always located in the slot 27 in the spanner assembly 20. The slot 27 provides a limit to rotation when force is applied to the handles 24 and in turn to the electronic component 13 during the removal process. The limited rotational motion safeguards against accidental over-travel which may result in a collision of components 13.

FIG. 3 shows the details of the variable jaw assembly 18 employed in the removal tool of FIG. 1. The variable jaw assembly 18 is comprised of a housing 31 that is attached to the shaft 19. Two pivotable jaws 32 are secured to the housing 31 and are each rotatable around a pivot shaft 37. A partially threaded shaft 38 has a left-hand threaded portion 33 and a right-hand threaded portion 34 and is threaded through holes through the respective jaws 37. The partially threaded shaft 38 is secured in the housing 31 by nuts 39. A center portion of the partially threaded shaft 38 has a knurled disk 35 attached thereto that permits turning thereof in response to rotation of the disk 35. Rotation of the disk 35 causes inward and outward movement of the two jaws 32 as is indicated by the arrows in FIG. 3. For illustration, one jaw 32 is shown in phantom and is moved to a relatively open position. Opening and closing the jaws secures the adapter 17 in the jaws 32.

FIG. 4 shows the torque handle assembly 23 employed in the removal tool 10 of FIG. 1. As is shown in FIG. 4, the torque handle assembly 23 has two threaded handles 24 that secure two L-shaped blocks 25 around the square portion of the shaft 19 of the variable jaw assembly 18. The L-shaped blocks 25 are locked firmly in place by rotating the two threaded handles 24 which pulls the two blocks 25 together because of the screw threads 29 that pass through each block 25 to secure the variable jaw assembly 18 to the shaft 19 by rotating both handles 24 which pulls the two L-shaped blocks 25 together around tile shaft 19.

In operation, the removal tool 10 removes the component 13 from the printed wiring board 11 is as follows. The printed wiring board 11 is secured into the housing 10a using the securing means 30 (or support block 12, end stop 14, swivel block 15) and thumb screws 16, which exert force on the printed wiring board 11 to hold it in place.

The adapter 17 is disposed so as to grasp the component 13. The variable jaw assembly 18 is then secured to the adapter 17. A closing force is applied to the adapter 17 to facilitate a firm hold on the component 13 by the variable jaw assembly 18. The jaws 32 are tightened to secure them to the adapter 17, and hence to the component 13.

The spanner assembly 20 is anchored to the housing directly over the shaft 19 of the jaw assembly 18 using the two locking assemblies 28. The slider block 21 is captivated by the slot 27 in the spanner assembly 20 and is used to guide the shaft 19 of the jaw assembly 18 in a vertical ("y") direction. The second thumb screw 22 is used to lock the slider block 21 and hence tile variable jaw assembly 18 directly over the component 13 that is to be removed.

The torque handle assembly 23 is locked to the square portion of the shaft 19 of the variable jaw assembly 18. This is done by rotating both handles 24 to pull the two L-shaped blocks 25 together around the shaft 19. The two L-shaped blocks 25 gasp the shaft 19, and locate the dowel pins 26 in the slot 27. This limits the rotation of the variable jaw assembly 18 when torque is applied. The handles 24 are then rotated within the limits defined by the relative dimensions of the dowel pins 26 and slot 27. This rotation, sustained for a period of up to a minute or so, causes breaking of the bond between the bonding material 13a and the electronic component 13, which permits removal of the component 13. The limited rotational motion implemented in the removal tool 10 safeguards against accidental over-travel which may result in destruction of components 13.

The present removal tool 10 has been built and tested, and is used in a component removal procedure by the assignee of the present invention. The performance of the present removal tool 10 is consistent and reliable in that it is capable of safely removing a large variety of components 13 from printed wiring boards 11, and adjacent components 13 are not disturbed. Because the printed wiring board 11 is firmly secured, damage to the surface of the printed wiring board 11 is avoided. Furthermore, various customized adapters 17 allow for sufficient flexibility to permit the removal of many different sized components 13. The use of the present removal tool 10 does not require the application of heat as is employed in conventional techniques.

Thus there has been described a new and improved removal tool for use with such gate arrays and hybrids disposed on printed wiring boards. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A removal tool for use in removing a component bonded to a printed wiring board with bonding material, said removal tool comprising:
    a housing;
    securing means for securing the printed wiring board to the housing;
    an adapter for holding tile component that is to be removed;
    a variable jaw assembly couplable to the adapter for applying a closing force to the adapter to hold the component;
    a spanner assembly coupled to the housing that comprises a variable position slider block for holding the jaw assembly in a vertical orientation relative to the component;
    locking means coupled to tile spanner assembly for securing the spanner assembly to the housing;
    second securing means coupled to the spanner assembly for locking the slider block and securing the variable jaw assembly above the component that is to be removed; and
    a lockable and rotatable torque handle assembly coupled to the jaw assembly that is rotatable to apply torque to the component to break the bond between the component and the printed wiring board.

2. The removal tool of claim 1 wherein the securing means comprises a support block for supporting tile printed wiring board, an end stop disposed at one end of the printed wiring board, a swivel block disposed at an end of the printed wiring board opposite the end stop, and a locking means coupled to the swivel block.

3. The removal tool of claim 1 wherein the locking means comprises a thumb screw.

4. The removal tool of claim 1 wherein the bonding material comprises polysulfide adhesive.

5. The removal tool of claim 1 wherein the component comprises a gate array.

6. The removal tool of claim 1 wherein the component comprises a hybrid.

7. The removal tool of claim 1 wherein the slider block is captivated by a slot in the spanner assembly that is used to lock the jaw assembly in a vertical direction.

8. The removal tool of claim 1 wherein the torque handle assembly comprises two handles.

9. The removal tool of claim 8 wherein the torque handle assembly is locked firmly in place by rotating both handles.

10. The removal tool of claim 8 wherein the slot provides a limit to rotation when force is applied to the handles during removal of the component.

11. The removal tool of claim 1 wherein the lockable and rotatable torque handle assembly comprises two L-shaped blocks for grasping a shaft of the variable jaw assembly and anchoring two dowel pins.

12. The removal tool of claim 1 wherein the spanner assembly is coupled to the housing by means of two locking assemblies.

13. The removal tool of claim 1 wherein the variable jaw assembly comprises:
    a housing;
    two pivotable jaws secured to the housing that are each rotatable around a pivot shaft;
    a partially threaded shaft having a left-hand threaded portion and a right-hand threaded portion disposed through the respective jaws; and
    a knurled disk attached to a center portion of the partially threaded shaft having that permits turning thereof in response to rotation of the disk.

* * * * *